United States Patent
Jangity et al.

(10) Patent No.: US 9,761,521 B1
(45) Date of Patent: Sep. 12, 2017

(54) FLEXIBLE AND ROBUST POWER GRID CONNECTIVITY

(71) Applicant: APPLIED MICRO CIRCUITS CORPORATION, Sunnyvale, CA (US)

(72) Inventors: Arun Jangity, Sunnyvale, CA (US); Srini Gbalakrishnan, San Jose, CA (US); Tai Chong, Los Gatos, CA (US)

(73) Assignee: MACOM CONNECTIVITY SOLUTIONS, LLC, Lowell, MA (US)

( * ) Notice: Subject to any disclaimer, the term of this patent is extended or adjusted under 35 U.S.C. 154(b) by 15 days.

(21) Appl. No.: 14/519,271

(22) Filed: Oct. 21, 2014

(51) Int. Cl.
| H01L 21/48 | (2006.01) |
| H01L 21/52 | (2006.01) |
| H01L 23/50 | (2006.01) |
| H01L 23/00 | (2006.01) |

(52) U.S. Cl.
CPC .............. H01L 23/50 (2013.01); H01L 24/46 (2013.01); H01L 24/85 (2013.01)

(58) Field of Classification Search
None
See application file for complete search history.

(56) References Cited

U.S. PATENT DOCUMENTS

| 5,945,713 | A | 8/1999 | Voldman |
| 6,192,431 | B1 * | 2/2001 | Dabral .................... H01L 23/50 257/E23.079 |
| 6,467,074 | B1 | 10/2002 | Katsioulas et al. |
| 6,838,713 | B1 * | 1/2005 | Gheewala ......... H01L 27/11807 257/211 |
| 7,462,941 | B2 | 12/2008 | Campbell et al. |
| 8,086,980 | B2 | 12/2011 | Vogel |
| 8,701,068 | B2 | 4/2014 | McElvain et al. |
| 8,738,351 | B2 | 5/2014 | Coyne et al. |
| 8,786,130 | B1 | 7/2014 | Mori et al. |
| 2004/0049754 | A1 * | 3/2004 | Liao ..................... G06F 17/5068 716/120 |
| 2006/0095872 | A1 * | 5/2006 | McElvain ........... G06F 17/5077 716/113 |
| 2010/0122230 | A1 * | 5/2010 | Qiu ......................... G06F 17/50 716/118 |
| 2014/0013296 | A1 * | 1/2014 | Hayashi .................. G06F 17/50 716/136 |
| 2014/0264924 | A1 * | 9/2014 | Yu ....................... H01L 23/5286 257/774 |

* cited by examiner

*Primary Examiner* — Julio J Maldonado
*Assistant Examiner* — Stanetta Isaac
(74) *Attorney, Agent, or Firm* — Amin, Turocy & Watson LLP

(57) ABSTRACT

Various embodiments provide for flexible and robust power grid connectivity in a server on a chip environment. The power grid has three parallel conductors, (e.g., wires) which represent two power polarities. The outside two wires can be of a first polarity (e.g. Vdd), while the middle wire is of a second polarity (e.g., Vss). The polarities of the wires can also be switched, as long as the two outside wires have the same polarity, while the inside wire has a different polarity. Power pins from modules adjacent to the set of three wires make connections to the nearest wire of the matching polarity. In this way, every power pin on the modules can be connected to the power grid without need for special alignment or custom power pins.

18 Claims, 8 Drawing Sheets

US 9,761,521 B1

FLEXIBLE AND ROBUST POWER GRID CONNECTIVITY

TECHNICAL FIELD

The subject disclosure relates to power grid connectivity for IP integration in a server on a chip environment.

BACKGROUND

On integrated circuits and within chips, power is supplied to modules via a power grid. Due to a lack of standardization for power connections on modules, it can be difficult to ensure that every power pin connects to the power grid. As a result, modules may be underpowered and may not perform as designed. The power pin connections can be mitigated somewhat by carefully placing and offsetting the modules as necessary in order to maximize the number of connections that can be made, but this is a time and labor consuming process that still does not guarantee that every single power pin connection can be made.

The above-described description is merely intended to provide a contextual overview of current techniques for providing power grid interfaces in a server on a chip and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a power grid interface comprises a first conductor and a second conductor having a first polarity. The power grid interface also comprises a third conductor having a second polarity different from the first polarity, the third conductor positioned between the first conductor and the second conductor, wherein the first, second, and third conductors are configured to supply power to an integrated circuit.

In another example embodiment, a method for providing a power grid interface on a chip comprises arranging a first and a second conductor next to each other, wherein the first conductor and the second conductor have a first polarity. The method also includes arranging a third conductor, between the first and the second conductor, wherein the third conductor has a second polarity different from the first polarity. The method further includes providing electrical power to a module on the chip via connections between power pins and a closest conductor to the power pins matching a polarity of the power pins.

In another example embodiment, a system for providing power grid connectivity to modules on a chip comprises a means for arranging a set of three conductors next to each other, wherein the three conductors are of two polarities. The system also comprises a means for providing power to every power pin on the modules on the chip via the set of three conductors.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
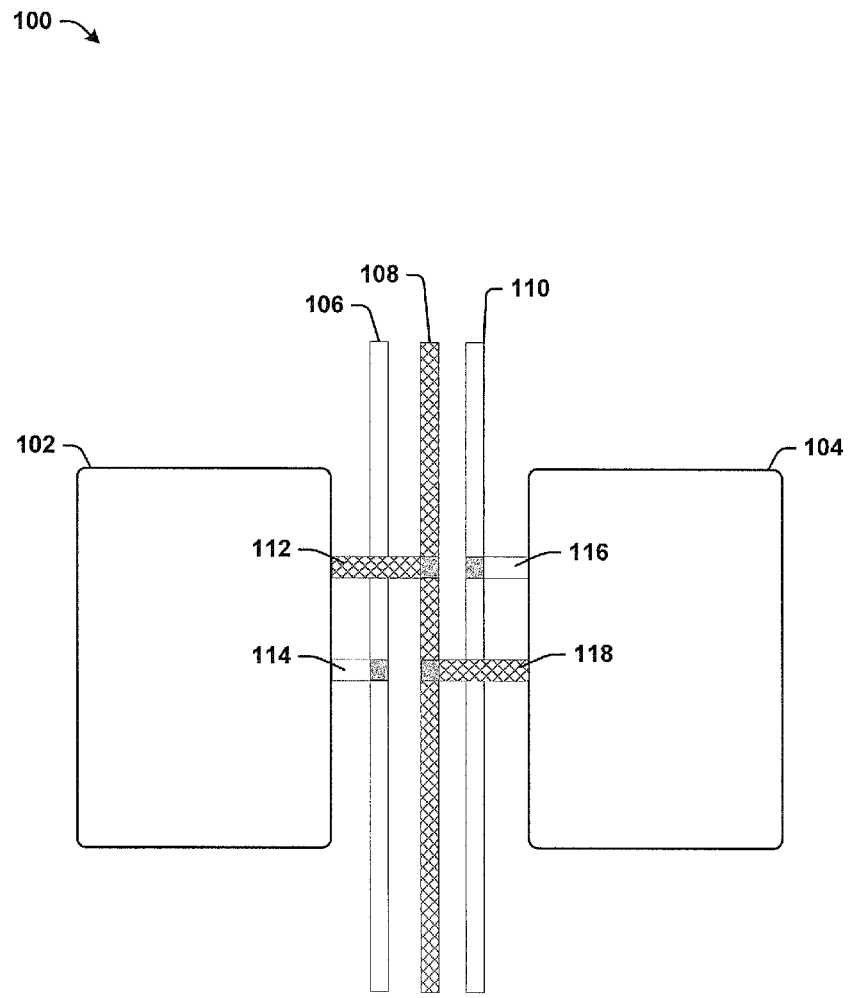
FIG. 1 is a block diagram illustrating an example, non-limiting embodiment of a power grid interface for providing power to modules in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various embodiments provide for flexible and robust power grid connectivity in a server on a chip environment. The power grid has three parallel wires which represent two power polarities. The outside two wires can be of a first polarity (e.g. Vdd), while the middle wire is of a second polarity (e.g., Vss). The polarities of the wires can also be switched, as long as the two outside wires have the same polarity, while the inside wire has a different polarity. Power pins from modules adjacent to the set of three wires make connections to the nearest wire of the matching polarity. In this way, every power pin on the modules can be connected to the power grid without need for special alignment or custom power pins. It is to be appreciated that while the specification refers to wires supplying power to modules on the server on a chip, this is merely an exemplary embodiment, and that in other embodiments, any type of conductor can be used to provide power.

Turning now to the illustrations, FIG. 1 illustrates a block diagram illustrating an example, non-limiting embodiment of a power grid interface 100 for providing power to modules in accordance with various aspects described herein. Power grid interface 100 includes a set of three wires 106, 108, and 110 that are configured to provide electrical power to modules 102 and 104. Module 102 and 104 (e.g., intellectual property "IP" cores) can be units of logic, cell or chip layout design that are the intellectual property of a party. Since the modules 102 and 104 can be made and/or designed by different vendors, the power pin connectors may not be designed to be compatible at all orientations and alignments in traditional power grid interfaces. Using the set of three wires 106, 108, and 110, however, power connections can be made to each of power pins 112, 114, 116, and 118.

Modules 102 and 104 can include power pins 112, 114, 116, and 118. In this exemplary embodiment, the polarity of power pins 114 and 116 correspond to a first polarity matching the polarity of wires 106 and 110, and the polarity of pins 112 and 118 match the polarity of wire 108. In an embodiment, the first polarity of wires 106 and 110 can be Vdd (positive supply) and the polarity of wire 108 can be Vss (negative and/or ground supply).

In traditional power grid interfaces, as long as the power pins are not aligned opposite each other, connections can be made to the wires by all power pins. In the case where power pins from adjacent modules are aligned opposite each other, such as power pin 112 and 116 as well as power pins 114 and 118, then it would not be possible to connect all the power pins in traditional 2 wire power grid interfaces. In the subject application however, since there are three wires, 106, 108, and 110, power connections can be made to all of the power pins. Power pin 112 can connect to the central wire 108 while power pin 116 can connect to wire 110. Similarly, power pin 114 can connect to wire 106, while power pin 118 connects to wire 108.

It is to be appreciated that while FIG. 1 shows that modules 102 and 104 have two power pins, 112, 114, and 116, 118 respectively, in other embodiments, other quantities and distributions of power pins are possible. It is also to be appreciated that power pins 112, 114, 116, and 118 can be on different layers than wires 106, 108, and 110. Connections between the power pins 112, 114, 116, and 118 and the wires 106, 108, and 110 can thus be connections between the layers or vertical connections. In other embodiments, power pins 112, 114, 116, and 118 and wires 106, 108, and 110 can be on substantially the same layer/level, and electrical contact is only made where connections are made between the pins and the wires.

Figure 2:
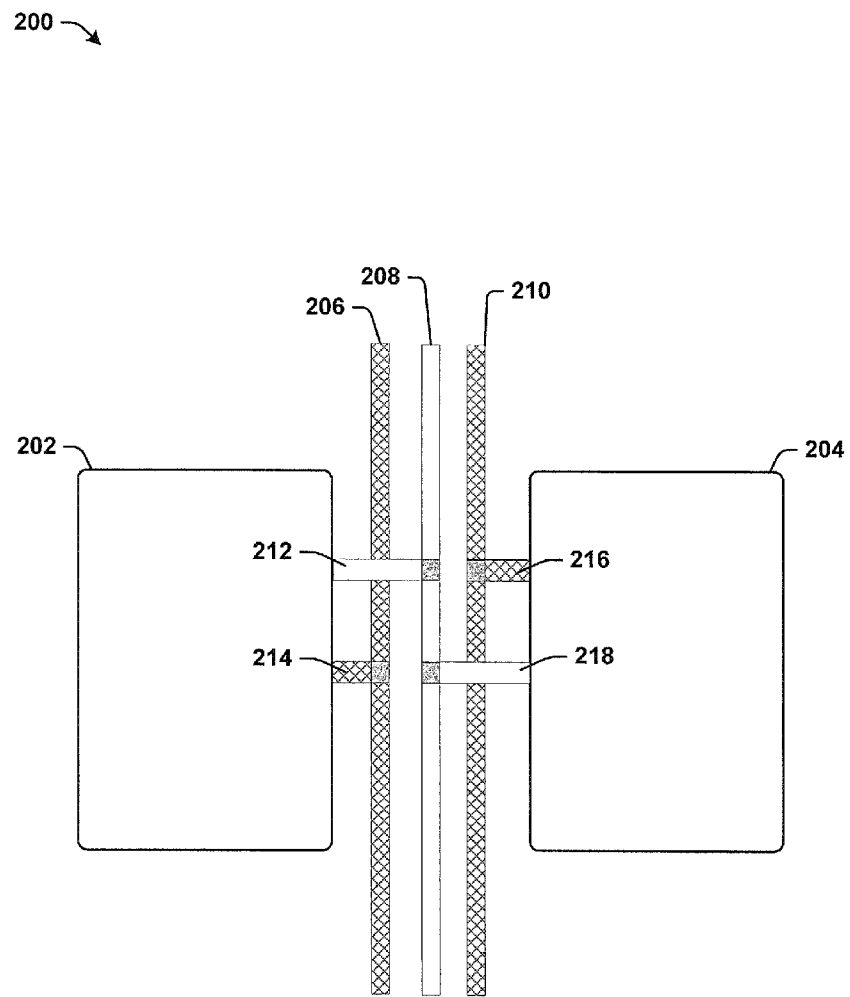
FIG. 2 is a block diagram illustrating another example, non-limiting embodiment of a power grid interface for providing power to modules in accordance with various aspects described herein.

Turning now to FIG. 2, illustrated is a block diagram of an example, non-limiting embodiment of a power grid interface 200 for providing power to modules in accordance with various aspects described herein. Power grid interface 200 includes a set of three wires 206, 208, and 210 that are configured to provide electrical power to modules 202 and 204. Module 202 and 204 (e.g., intellectual property "IP" cores) can be units of logic, cell or chip layout design that is the intellectual property of a party. Since the modules 202 and 204 can be made and/or designed by different vendors, the power pin connectors may not be designed to be compatible at all orientations and alignments in traditional power grid interfaces. Using the set of three wires 206, 208, and 210, however, power connections can be made to each of power pins 212, 214, 216, and 218.

In the power grid interface 200 shown in FIG. 2, the polarities of the wires and the power pins are reversed from the embodiment shown in FIG. 1 (power grid interface 100). Modules 202 and 204 can include power pins 212, 214, 216, and 218. In this exemplary embodiment, the polarity of power pins 214 and 216 correspond to a polarity matching the polarity of wires 206 and 210, and the polarity of pins 212 and 218 match the polarity of wire 208. In an embodiment, the first polarity of wires 206 and 210 can be Vss (negative or ground supply) and the polarity of wire 208 can be Vdd (positive supply).

Figure 3:
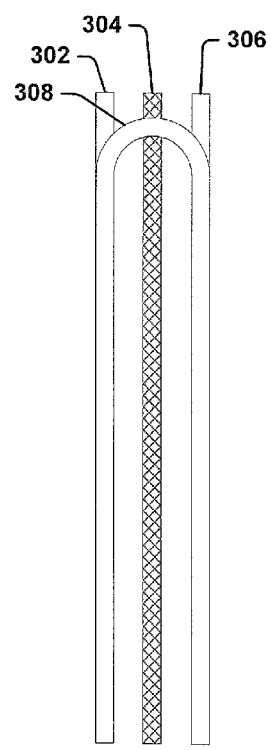
FIG. 3 is a block diagram illustrating an example, non-limiting embodiment of a power grid interface connection in accordance with various aspects described herein.

Turning now to FIG. 3, illustrated is a block diagram of an example, non-limiting embodiment of a power grid interface 300 in accordance with various aspects described herein. Power grid interface 300 has three wires, 302, 304, and 306 that are arranged in a parallel fashion with wires 302 and 306 having a first polarity and wire 304, arranged between wires 302 and 306, that has a second polarity.

In an embodiment, to minimize couplings to an external power supply, one of the wires 302 or 306 can be coupled to the external supply. A power connector 308 can bridge wire 304 and provide power to the other wire 306 or 302. This enables both wires 302 and 306 to be powered without having to make two connections to the external power supply.

In an embodiment, the connector 308 is in a different layer, and the connection between the wires 302 and 306 and the connector 308 can be via trans-layer connections. In another embodiment, the two wires can be connected in another metal layer or in an open area via a wired connection. In other embodiments, each of the wires 302, 304, and 306 can be in different layers, and connection 308 transverses one or more layers to make the connection between wires 302 and 306.

Figure 4A:
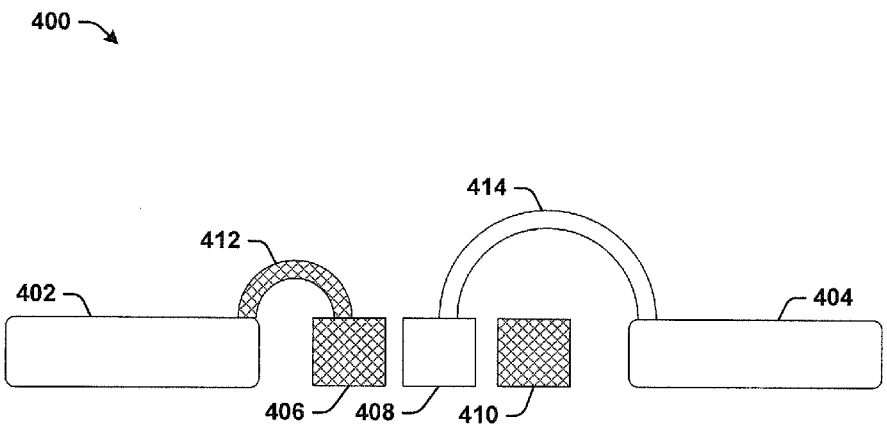
FIG. 4a is a block diagram illustrating an example, non-limiting embodiment of a power pin to grid connection in accordance with various aspects described herein.

Turning now to FIG. 4a, illustrated is a block diagram of an example, non-limiting embodiment of a power pin to grid connection in accordance with various aspects described herein. System 400 includes modules 402 and 404 that are powered via electrical contacts with wires 406, 408, and 410. In this example embodiment, the wires 406, 408 and 410 are in the same layer, and power pins 412 and 414 connect respectively to wires 406 and 408 respectively based on their matching polarities. In this case, wires 406 and 410 have a first polarity, and power pin 412 that also has a first polarity connects to the closest wire, which happens to be wire 406. Wire 408, which has a second polarity, connects to power pin 414 that also has the second polarity.

It is to be appreciated that although FIG. 4a shows power pins 412 and 414 as arcs, or semicircular connectors, in other embodiments they can be other shapes, configurations, and sizes.

Figure 4B:
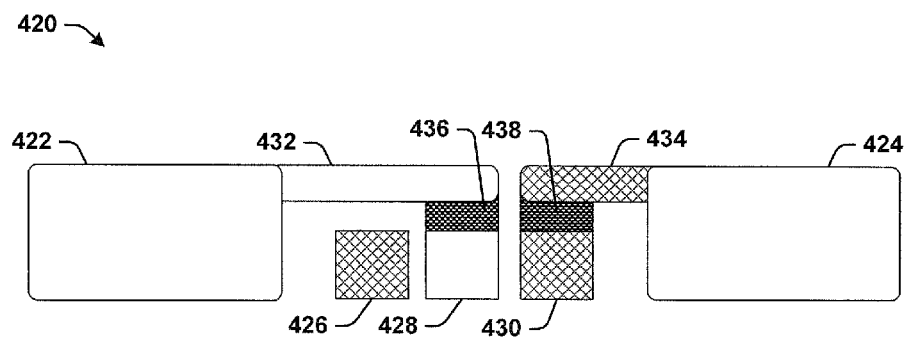
FIG. 4b is a block diagram illustrating an example, non-limiting embodiment of a power pin to grid connection in accordance with various aspects described herein.

Turning now to FIG. 4b, illustrated is a block diagram of an example, non-limiting embodiment of a power pin to grid connection in accordance with various aspects described herein. System 420 includes modules 422 and a 424 that are powered via electrical contacts with wires 426, 428, and 430. In this example embodiment, the wires 426, 428, and 430 are in a different layer from the power pins 432 and 434 coming from modules 422 and 424 respectively. Because they are in different layers, the power pins 432 and 434 extend over the wires 428 and 430 that they are connecting to respectively, and electrical connections 436 and 438 are formed respectively to provide power to the modules.

Figure 5:
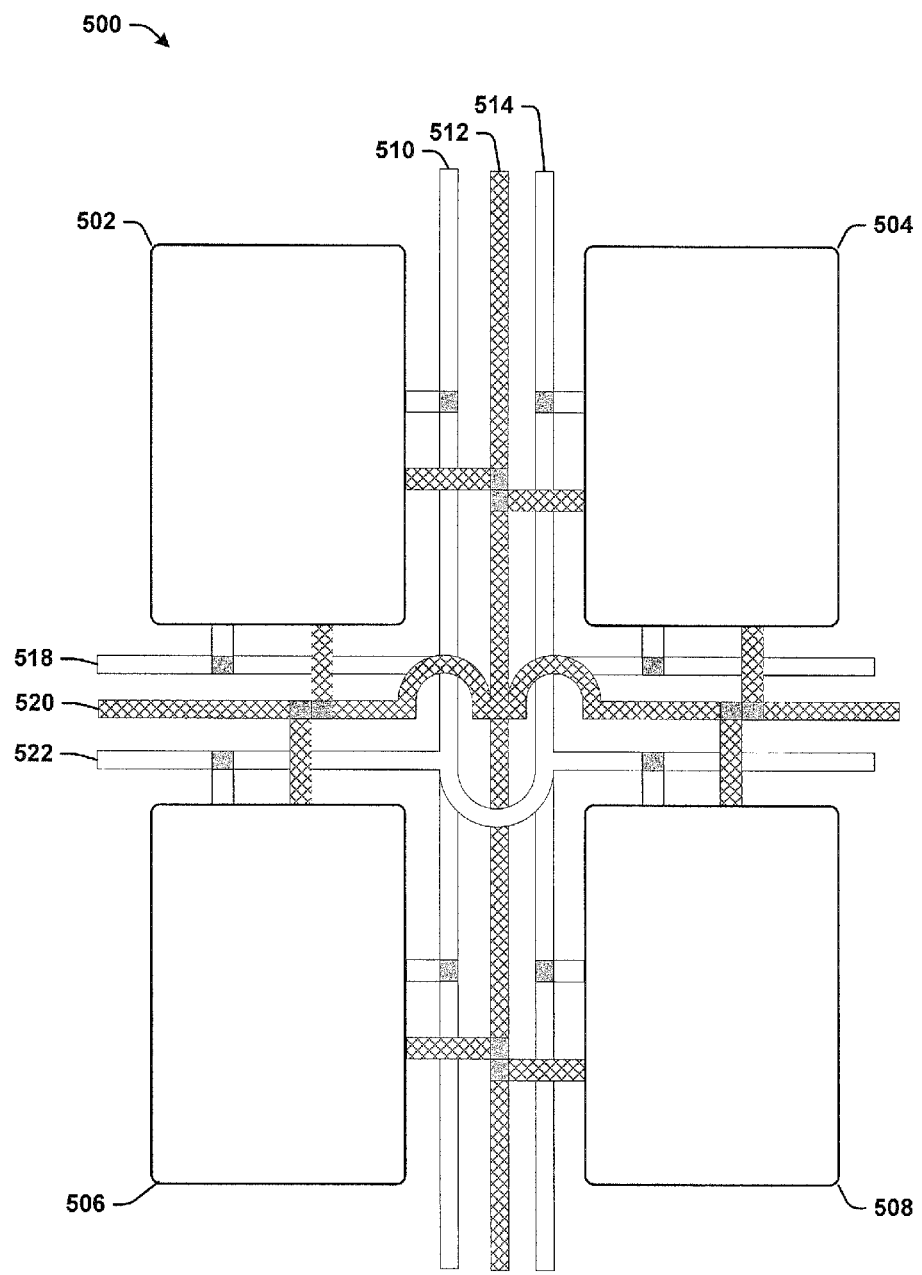
FIG. 5 is a block diagram illustrating an example, non-limiting embodiment of a power grid interface in accordance with various aspects described herein.

Turning now to FIG. 5, illustrated is a block diagram of an example, non-limiting embodiment of a power grid interface 500 in accordance with various aspects described herein. The power grid interface 500 is substantially similar to the power grid interfaces 100 and 200 shown in FIGS. 1 and 2, just with additional modules showing how the power grid interface can scale up. Modules 502, 504, 506 and 508 can include power couplings on more than one side, facilitated by two sets of three wires, 510, 512, and 514 as well as 518, 520, and 522. It is to be appreciated that modules 502, 504, 506 and 508 can be completely surrounded by the power grid interface on all sides, and so depending on the geometry of the chip or module, three or more sides of the modules can have power pins that connect to the power grid interface on the chip.

Figure 6:
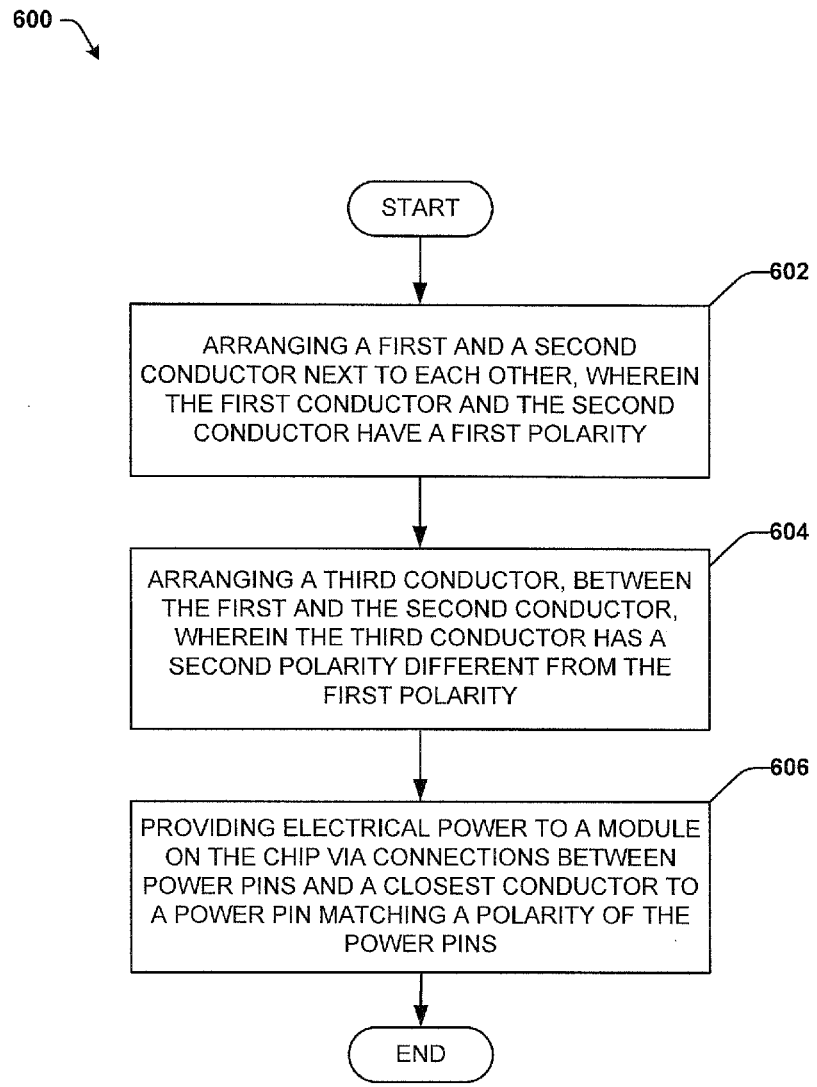
FIG. 6 illustrates a flow diagram of an example, non-limiting embodiment of a method for providing a power grid interface on a chip.
Figure 7:
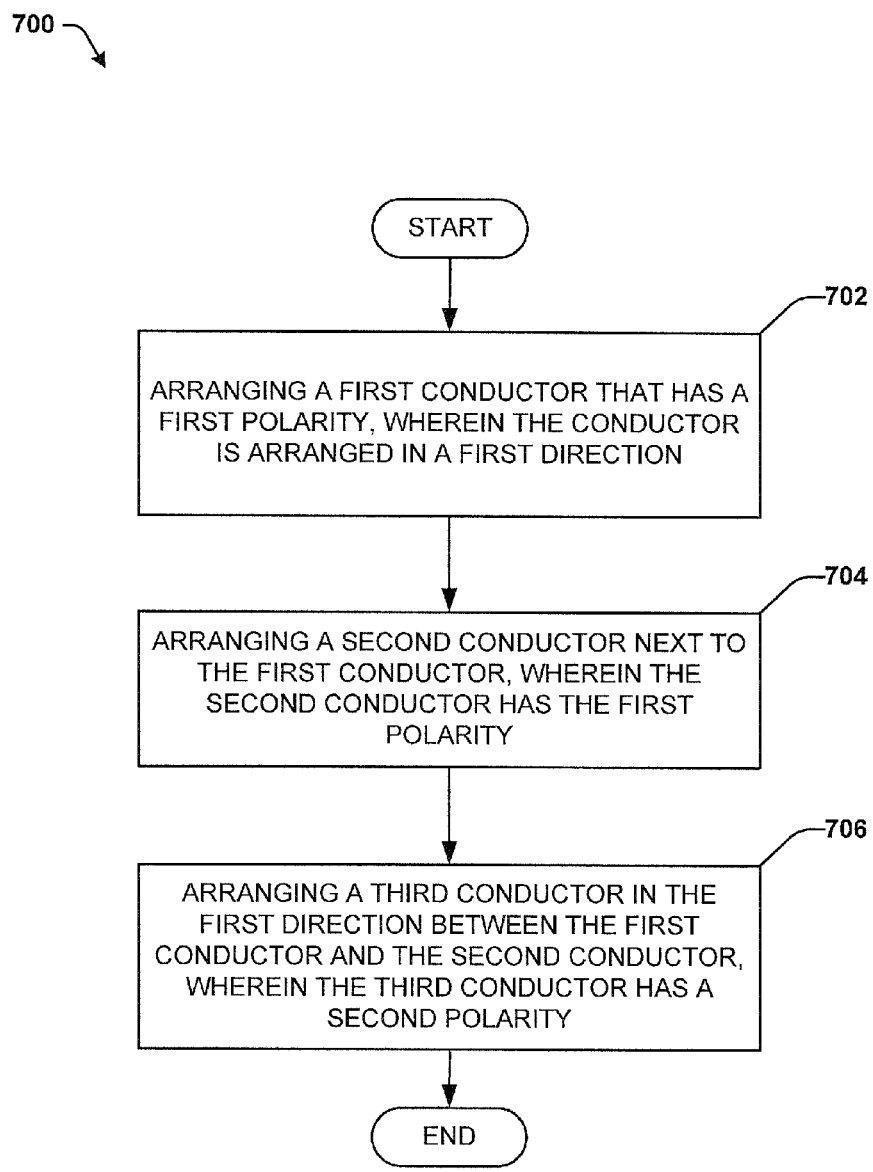
FIG. 7 illustrates a flow diagram of an example, non-limiting embodiment of a means for arranging a set of three wires parallel to each other.
Figure 8:
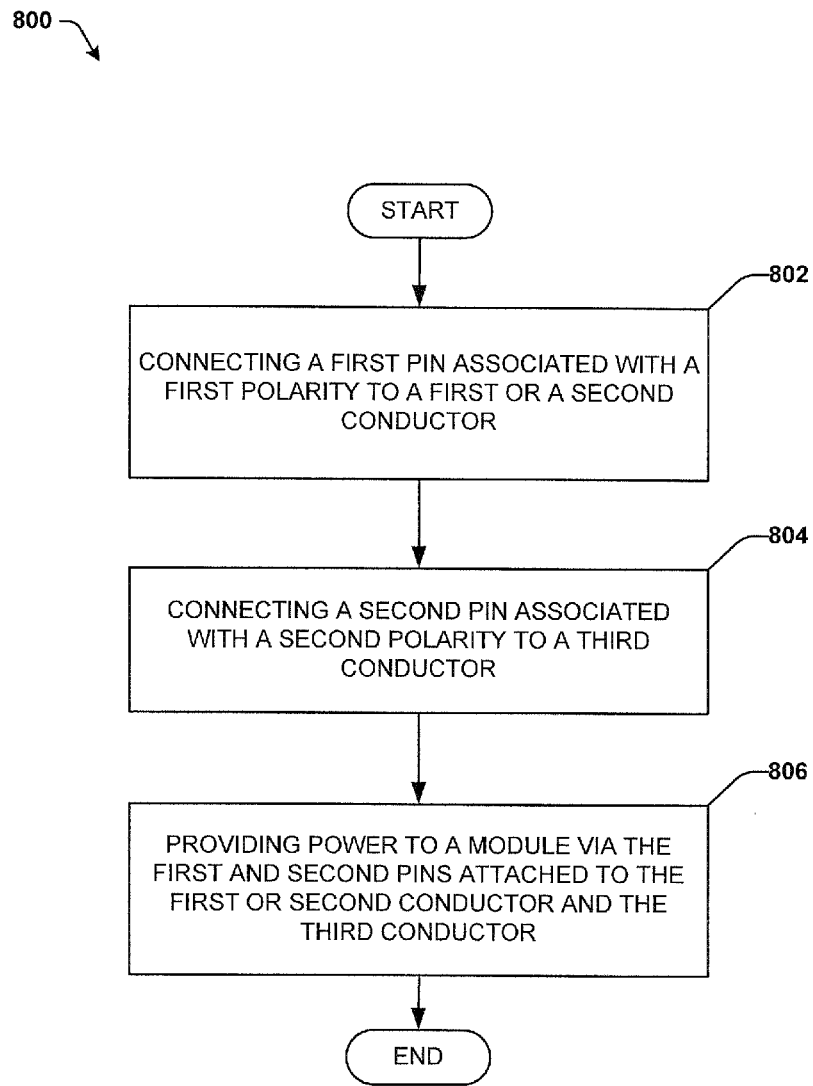
FIG. 8 illustrates a flow diagram of an example, non-limiting embodiment of a means for providing power to every power pin on the modules via the set of three wires.

FIGS. 6-8 illustrate processes in connection with the aforementioned systems. The process in FIGS. 6-8 can be implemented for example by systems 100, 200, 300, 400, and 500 and illustrated in FIGS. 1-5 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

FIG. 6 illustrates a flow diagram of an example, non-limiting embodiment of a method for providing a power grid interface on a chip.

Method 600 can start at 602, where a first conductor and a second conductor next to each other are arranged, where the first conductor and the second conductor have a first polarity. The first polarity can either be a Vdd or Vss polarity (positive power supply or negative power supply). In an embodiment, the conductors or wires can be on the same layer, and in other embodiments, the wires can be on different layers.

At 604, a third conductor is arranged between the first and the second conductor, parallel to the first and the second conductor, wherein the third conductor has a second polarity different from the first polarity. Accordingly, the polarity of the third conductor can be Vss (negative power supply) if the first and the second conductor are Vdd, and vice versa. Again, in an embodiment, the conductor can be on the same layer as each other, or in other embodiments, the conductor can be on different layers.

At 606, electrical power is provided to a module on the chip via connections between power pins and a closest conductor to the power pins matching a polarity of the power pins. The module's power pins can make electrical contact with the closest wire matching the polarity of the power pin. Thus, if the power pin is configured to accept a positive power supply, the power pin can connect to either the outside or the inside wire closest to the module. In an embodiment, the power pins can be on a different layer than the wires, and the connection can be made via a connection that transverses one or more layers.

Turning now to FIG. 7, illustrated is a flow diagram 700 of an example, non-limiting embodiment of a means for arranging a set of three conductor next to each other. The flow diagram 700 can start at 702 where a first conductor is arranged in a first direction, wherein the first conductor has a first polarity. At 704, a second conductor, parallel to the first conductor is arranged, wherein the second conductor also has a first polarity. At 706, a third conductor is arranged in the first direction between the first conductor and the second conductor, and the third wire has a second polarity.

Turning now to FIG. 8, illustrated is a flow diagram 800 of an example, non-limiting embodiment of a means for providing power to every power pin on the modules via the set of three conductor. The flow diagram 800 can start at 802, wherein a first pin associated with a first polarity is connected to a first conductor or a second conductor that matches the first polarity. The conductor that the power pin is connected to is based on the proximity of the first and the second conductor to the module from which the power pin extends. Generally, the power pin will not cross over a conductor that matches its polarity without making a connection.

At 804, a second pin associated with a second polarity is attached to the third conductor. The third conductor is also associated with the second polarity, and it is the opposite polarity from the first and second conductor (positive vs negative power supplies and etc.). At 806 power to the module is provided via the first and the second pins attached to the first or second wire and the third wire.

Reference throughout this specification to "one embodiment," "an embodiment," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

Other than where otherwise indicated, all numbers, values and/or expressions referring to quantities of items such as memory size, etc., used in the specification and claims are to be understood as modified in all instances by the term "about."

What is claimed is:

1. A power grid interface, comprising:
   a first conductor and a second conductor having a first polarity, the first polarity is one of Vdd or Vss; and
   a third conductor having a second polarity different from the first polarity, the third conductor positioned between the first conductor and the second conductor, wherein the first, second, and third conductors are in between two integrated circuit modules and are configured to supply power to the integrated circuit modules and wherein a first power pin from a first integrated circuit module and a second power pin from a second integrated circuit module, that are directly adjacent to each other, connect to the first conductor and second conductor respectively.

2. The power grid interface of claim 1, wherein the first conductor and the second conductor are Vdd conductors and the third conductor is a Vss conductor.

3. The power grid interface of claim 1, wherein the first conductor and the second conductor Vss conductors and the third conductor is a Vdd conductor.

4. The power grid interface of claim 1, wherein power pins from modules adjacent the set of three conductors connect to the first conductor and the second conductor in response to the power pins being configured for accepting the first polarity.

5. The power grid interface of claim 1, wherein power pins from modules adjacent to the set of three conductors connect to a closest conductor having a polarity matching the polarity of the power pins.

6. The power grid interface of claim 5, wherein the power pins from the modules are aligned directly across from each other.

7. The power grid interface of claim 1, wherein a power pin from a module of the modules do not cross over another connection from an adjacent power pin when making a connection to one of the conductors.

8. The power grid interface of claim 1, wherein the set of three conductors are on a same layer.

9. The power grid interface of claim 1, further comprising a second set of three conductors, wherein the set of three conductors and the second set of three conductors are in different orientations and are on different layers.

10. A system for providing power grid connectivity to modules on a chip, comprising:
 means for arranging a set of three conductors next to each other, the three conductors being of two polarities, the outside conductors being a first polarity and the inside conductor being a second polarity; and
 means for providing power to directly adjacent power pins on the modules on the chip via the set of three conductors, the directly adjacent power pins connecting to the outside conductors, wherein the three conductors positioned between the modules to which power is provided.

11. The power grid interface of claim 1, wherein the first conductor, second conductor, and the third conductor are in a channel in between the first integrated circuit module and the second integrated circuit module.

12. A power grid system, comprising:
 a set of three conductors parallel to each other, a first conductor and a second conductor being on the outside of the set of three conductors and being a first polarity, and a third conductor in between the first conductor and the second conductor being a second polarity, and integrated circuit modules on either side of the set of three conductors having power pins directly adjacent to each other and corresponding to the first polarity connect to the first conductor and second conductor.

13. The power grid system of claim 12, wherein the first conductor and the second conductor are positive power supply conductors and the third conductor is a negative power supply conductor.

14. The power grid system of claim 12, wherein the first conductor and the second conductor are negative power supply conductors and the third conductor is a positive power supply conductor.

15. The power grid system of claim 12, wherein power pins from the integrated circuit modules adjacent the set of three conductors connect to the first conductor and the second conductor in response to the power pins being configured for accepting the first polarity.

16. The power grid system of claim 12, wherein power pins from the integrated circuit modules adjacent to the set of three conductors connect to a closest conductor having a polarity matching the polarity of the power pins.

17. The power grid system of claim 12, wherein a power pin from a module of the integrated circuit modules do not cross over another connection from an adjacent power pin when making a connection to one of the conductors.

18. The power grid system of claim 12, wherein the set of three conductors are on a same layer.

* * * * *